United States Patent
Bilas et al.

(10) Patent No.: US 11,654,842 B2
(45) Date of Patent: May 23, 2023

(54) WIRING HARNESS ASSEMBLY

(71) Applicant: Aptiv Technologies Limited, St. Michael (BB)

(72) Inventors: Jared Bilas, North Bloomfield, OH (US); Kurt P. Seifert, Cortland, OH (US); David G. Siegfried, Warren, OH (US); David R. Peterson, Aurora, OH (US); Frank W. Szuba, Jr., El Paso, TX (US); Mark Intihar, San Jose, CA (US)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 0 days.

(21) Appl. No.: 17/538,258

(22) Filed: Nov. 30, 2021

(65) Prior Publication Data

US 2022/0089107 A1    Mar. 24, 2022

Related U.S. Application Data (63) Continuation of application No. 16/382,453, filed on Apr. 12, 2019, now Pat. No. 11,225,206.

(51) Int. Cl.
*H01B 7/00* (2006.01)
*B60R 16/02* (2006.01)
(Continued)

(52) U.S. Cl.
CPC ....... *B60R 16/0215* (2013.01); *H01B 7/0045* (2013.01); *H01B 7/04* (2013.01);
(Continued)

(58) Field of Classification Search
CPC .... H60R 16/0215; H01B 7/0045; H01B 7/04; H01B 7/08; H01R 12/61; H05K 3/361
See application file for complete search history.

(56) References Cited

U.S. PATENT DOCUMENTS 3,264,403 A    8/1966   Erdle
4,381,420 A    4/1983   Elliott et al.
(Continued)

FOREIGN PATENT DOCUMENTS

CN    101433132 A    5/2009
DE    10260786 A1    7/2004
(Continued)

OTHER PUBLICATIONS

Extended European Search Report for EP Application No. 20168115.2, dated Sep. 8, 2020, 8 pages.
(Continued)

*Primary Examiner* — Dinh T Le
(74) *Attorney, Agent, or Firm* — Billion & Armitage (57) ABSTRACT

A wiring harness assembly includes a first flexible planar wire cable having a first plurality of separated conductors formed in a first insulating layer comprising a first substantially flat exterior surface, a second flexible planar wire cable having a second plurality of separated conductors formed in a second insulating layer comprising a second substantially flat exterior surface, and a first plurality of apertures formed in the first substantially flat exterior surface and a second plurality of apertures formed in the second substantially flat exterior surface. The first and second plurality of apertures are sized, shaped, and arranged such that an electrical connection is made between the first and second plurality of separated conductors through the first and second plurality of apertures.

20 Claims, 11 Drawing Sheets

(51) Int. Cl.
*H01B 7/04* (2006.01)
*H01B 7/08* (2006.01)
*H01R 12/61* (2011.01)
*H05K 3/36* (2006.01)

(52) U.S. Cl.
CPC ............... *H01B 7/08* (2013.01); *H01R 12/61* (2013.01); *H05K 3/361* (2013.01)

(56) References Cited

U.S. PATENT DOCUMENTS

| | | |
|---|---|---|
| 6,454,582 B2 | 9/2002 | Yamanashi et al. |
| 9,147,089 B2 | 9/2015 | Takahashi |
| 9,722,338 B2 | 8/2017 | Tominaga et al. |
| 9,781,832 B2 | 10/2017 | Kato et al. |
| 2003/0070830 A1 | 4/2003 | Kondo et al. |
| 2012/0285723 A1 | 11/2012 | Gundel et al. |
| 2013/0341072 A1 | 12/2013 | Lin et al. |
| 2016/0036151 A1 | 2/2016 | Tominaga et al. |
| 2017/0243676 A1 | 8/2017 | Yang et al. |
| 2018/0068761 A1 | 3/2018 | Chin |
| 2019/0217794 A1 | 7/2019 | Chandra et al. |

FOREIGN PATENT DOCUMENTS

| | | |
|---|---|---|
| JP | 2003070830 A | 3/2003 |
| JP | 2008108578 A | 5/2008 |
| KR | 100862976 B1 * | 10/2008 |
| WO | 2017222073 A1 | 12/2017 |

OTHER PUBLICATIONS

U.S. Appl. No. 16/203,691, filed Nov. 29, 2018, Jared Bilas.
Chinese Office Action for CN Application No. 202010279388.9, dated Apr. 11, 2022, 5 pages.

* cited by examiner

WIRING HARNESS ASSEMBLY

CROSS-REFERENCE TO RELATED APPLICATION

This application is a continuation application that claims benefit of priority to co-pending U.S. application Ser. No. 16/382,453 filed on Apr. 19, 2019, the entire disclosure of which is hereby incorporated by reference.

TECHNICAL FIELD OF INVENTION

This disclosure generally relates to a wiring harness assembly, and more particularly relates to a wiring harness assembly having a flat cable bundle.

BRIEF DESCRIPTION OF DRAWINGS

The present invention will now be described, by way of example with reference to the accompanying drawings, in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
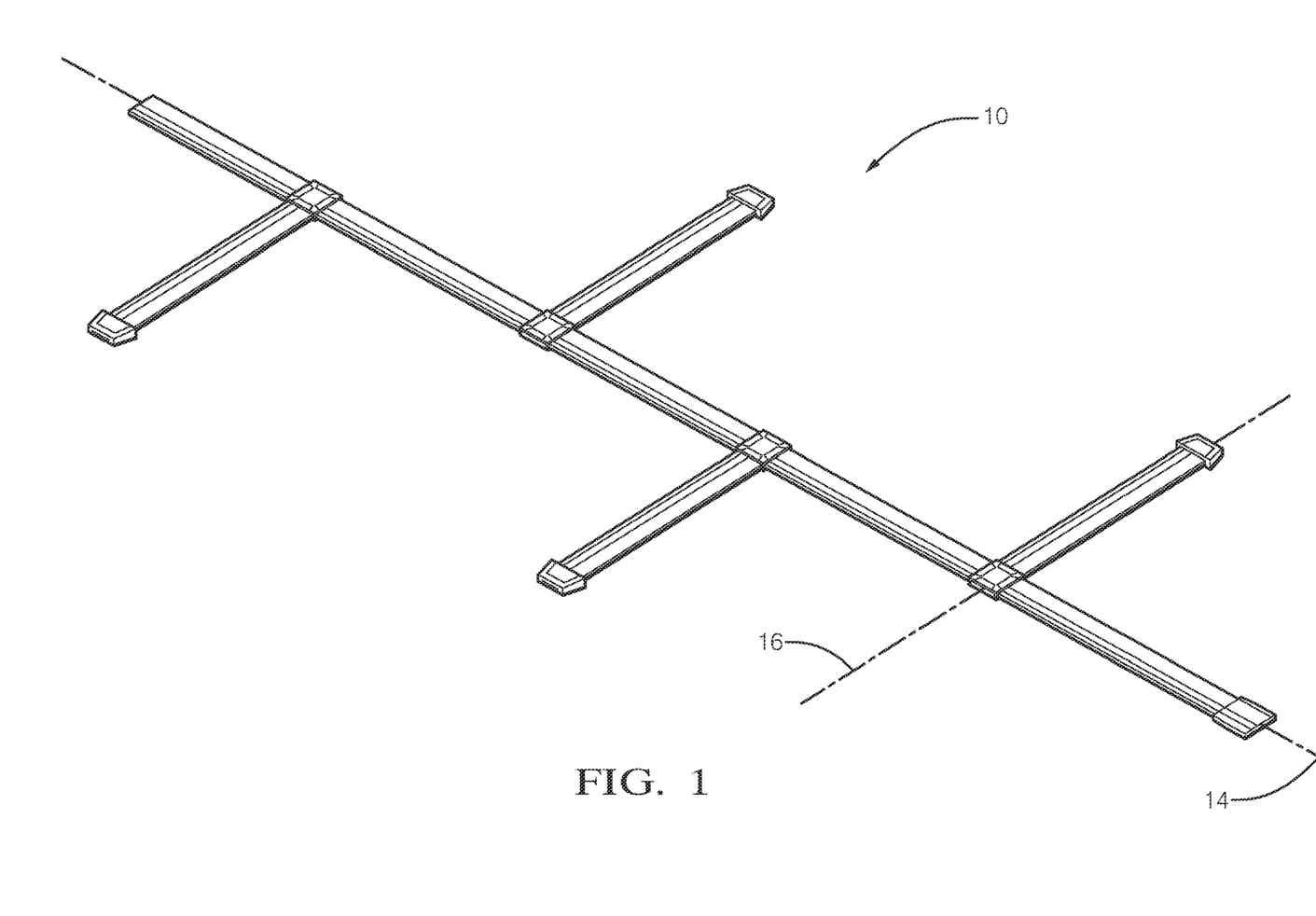
FIG. 1 is a perspective view of an illustration of a wiring harness assembly in accordance with one embodiment.

FIG. 1 illustrates a perspective view of a wiring harness assembly 10, hereafter referred to as the assembly 10. As will be described in more detail below, the assembly 10 is an improvement over other wiring harness assemblies because the assembly 10 combines electrical power, signal, and data channels in one flexible planar package. In an example, the assembly 10 includes connector bodies attached to ends of the assembly 10 configured to mate with corresponding connector bodies of a vehicle wiring system (not shown). In another example, the assembly 10 includes one or more branches that extend laterally from and/or parallel to the assembly 10. The one or more branches are configured to distribute electrical power, signals, and data to various systems that may be installed on the vehicle.

Figure 2:
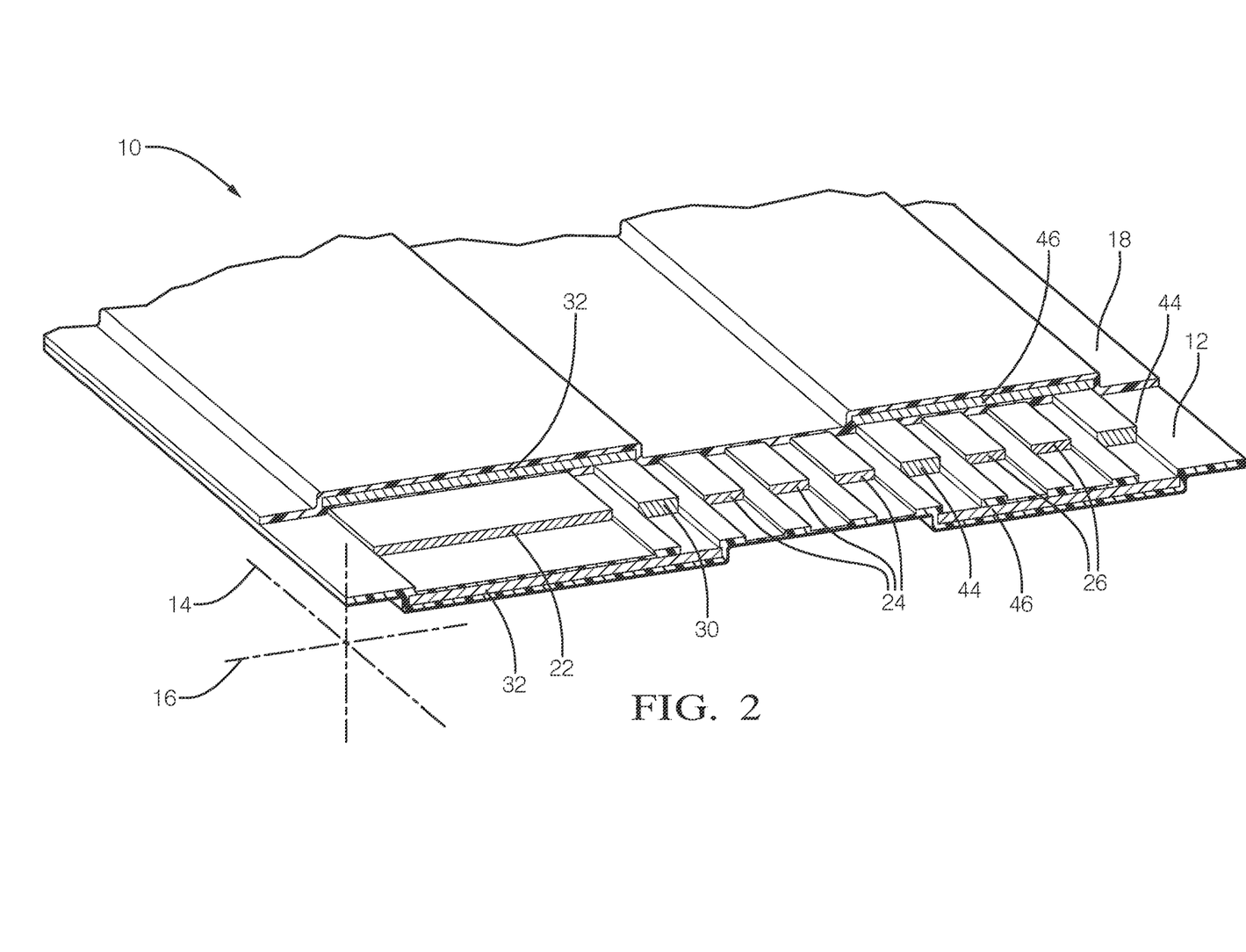
FIG. 2 is a perspective view of a portion of the wiring harness assembly of FIG. 1 illustrating a cross section of the assembly in accordance with one embodiment.

FIG. 2 is a perspective view of a portion of the assembly 10 of FIG. 1 illustrating a cross section of the assembly 10. The assembly 10 includes a first flexible planar substrate 12 extending continuously along both a longitudinal axis 14 and a lateral axis 16 of the assembly 10. The first flexible planar substrate 12 is formed of a polymeric material. The polymeric material may be any polymeric material that electrically isolates portions of the power, signal, and data channels. In one example, the first flexible planar substrate 12 is formed of the polymeric material polyethylene naphthalate (PEN). In another example, the first flexible planar substrate 12 is formed of the polymeric material polyimide (PI). In yet another example, the first flexible planar substrate 12 is formed of the polymeric material polyethylene terephthalate (PET). Other polymeric materials may be selected based on application requirements for electrical isolation (i.e., a dielectric breakdown strength), and/or temperature resistance, and/or mechanical properties (e.g., tensile strength, elongation, abrasion resistance, etc.) of the assembly 10. In an example, the first flexible planar substrate 12 has a thickness in a range of 15 micrometers (15 µm) to 100 µm and may be adjusted based on a dielectric constant of the polymeric material. In one example, the PEN polymeric material has a thickness of about 25 µm. In another example the PI polymeric material has a thickness of about 75 µm.

The assembly 10 also includes a second flexible planar substrate 18 overlaying the first flexible planar substrate 12, extending continuously along both the longitudinal axis 14 and the lateral axis 16 of the assembly 10. In the example illustrated in FIG. 2, the second flexible planar substrate 18 is formed of the same polymeric material as that of the first flexible planar substrate 12 described above and has the same thickness. In another example, the second flexible planar substrate 18 is formed of a different polymeric material than that of the first flexible planar substrate 12 described above. In yet another example, the second flexible planar substrate 18 is has a different thickness than that of the first flexible planar substrate 12 described above.

The assembly 10 also includes a plurality of separated conductors 20 interposed between the first flexible planar substrate 12 and the second flexible planar substrate 18. In the example illustrated in FIG. 2, the plurality of separated conductors 20 are encapsulated by the first flexible planar substrate 12 and the second flexible planar substrate 18. In an example, the encapsulation results from a lamination process of the first flexible planar substrate 12 and the second flexible planar substrate 18 by applying heat and pressure to opposing surfaces of the first flexible planar substrate 12 and the second flexible planar substrate 18, thereby joining the first flexible planar substrate 12 and the second flexible planar substrate 18 together. In an example, an adhesive 29 is also interposed between the first flexible planar substrate 12 and the second flexible planar substrate 18. It will be appreciated that the lamination process results in a seal at an interface between the first flexible planar substrate 12 and the second flexible planar substrate 18 that inhibits moisture intrusion. In an example, the first flexible planar substrate 12 and the second flexible planar substrate 18 are urged into spaces between the plurality of separated conductors 20 during the lamination process to create a dielectric barrier between the plurality of separated conductors 20.

The plurality of separated conductors 20 include at least one power conductor 22 configured to transmit electrical power, at least one signal conductor 24 configured to transmit electrical signals, and at least one data conductor 26 configured to transmit network data communications. The power conductor 22, signal conductor 24, and data conductor 26 may be arranged in any order along the lateral axis 16 of the assembly 10. In the example illustrated in FIG. 2, the power conductor 22 and data conductor 26 are arranged proximate the opposing edges of the assembly 10, with the signal conductor 24 disposed between the power conductor 22 and data conductor 26.

As used herein, transmission of electrical power includes the transmission of electrons where a voltage is typically greater than about five volts (5V), and an electrical current is typically greater than about one ampere (1 A). For example, a typical power conductor 22 in a vehicle may supply electrical power at battery voltage (i.e., 14V to 48V), and current at 15 A to 30 A. As used herein, transmission of electrical signals include the transmission of electrons where the voltage is typically less than about 5V, and the current is typically less than about 5 A. For example, a typical signal conductor 24 in a vehicle, used for switching a component on and off (e.g., electric door locks), may transmit electrical signals between about 0.0V and about 5V, and the current between about 0.0 A and about 0.1 A. In another example, the transmission of electrical signals includes a voltage-based state where a 0.0V signal denotes a "low" logic value (i.e., logical zero) and a full scale signal (e.g., 5V) denotes a "high" logic value (i.e., logical one). As used herein, transmission of network data communications include the transmission of electrons where the voltage is typically less than about 5V, and the current is typically less than about 0.1 A. For example, a typical data conductor 26 in a vehicle, such as a Computer Area Network (CAN) data conductor 26 used to send messages between various vehicle controllers and/or between vehicle controllers and electrical components, may transmit electrical signals between about 0.0V and about 5V, and current between about 0.0 A and about 0.05 A. In an example, the data communications are digital bit streams having a predetermined bit timing and structure. In the example illustrated in FIG. 2, the data conductor 26 further includes a pair of continuous strips of electrically conductive material (i.e., a data pair), such as copper, aluminum, silver, gold, or alloys thereof. In this example, the data pair enable the use of a differential voltage between the data pair as part of a message protocol. In an example, data transmission rates (i.e., baud rates) reach in excess of 1 million bits per second (1 Mbps).

In the example illustrated in FIG. 2, a spacing between the power conductor 22 and the adjacent signal conductor 24 is at least 1.0 mm, and the spacing between the signal conductor 24 and the adjacent data conductor 26 is at least 1.0 mm. The spacing between the adjacent plurality of separated conductors 20 are maintained at these values to provide adequate electrical isolation between the conductors to inhibit short circuits, and/or to inhibit crosstalk of the transmitted electrical signals. Crosstalk is a phenomenon in electronics where a signal transmitted on one wire or channel, creates an interference in another wire or channel. Crosstalk is a form of electromagnetic interference (EMI) that is caused by a magnetic field generated around a wire that is transmitting electrical current. The magnetic field from an interfering circuit may induce an electrical current in a nearby circuit creating electrical noise or interference.

In an example, the power conductor 22 comprises a single continuous strip of electrically conductive material, such as copper, aluminum, silver, gold, or alloys thereof. In another example, the electrically conductive material includes a conductive coating, such as tin or a tin alloy, to inhibit corrosion. In the example illustrated in FIG. 2, the power conductor 22 has a width greater than the signal conductor 24 and greater than the data conductor 26, the benefits of which will be described in more detail below. In order for the power conductor 22 to transmit the desired electrical power described above, an electrical resistance is kept to a minimum by adjusting a cross sectional area of the power conductor 22. In an example, the power conductor 22 has a width greater than 1 mm and a thickness less than about 1.0 mm. In another example, the power conductor 22 has a width of about 10 mm, and a thickness of about 0.125 mm. In the example illustrated in FIG. 2, the power conductor 22 has a width of about 10 mm, and a thickness of about 0.7 mm.

Figure 3A:
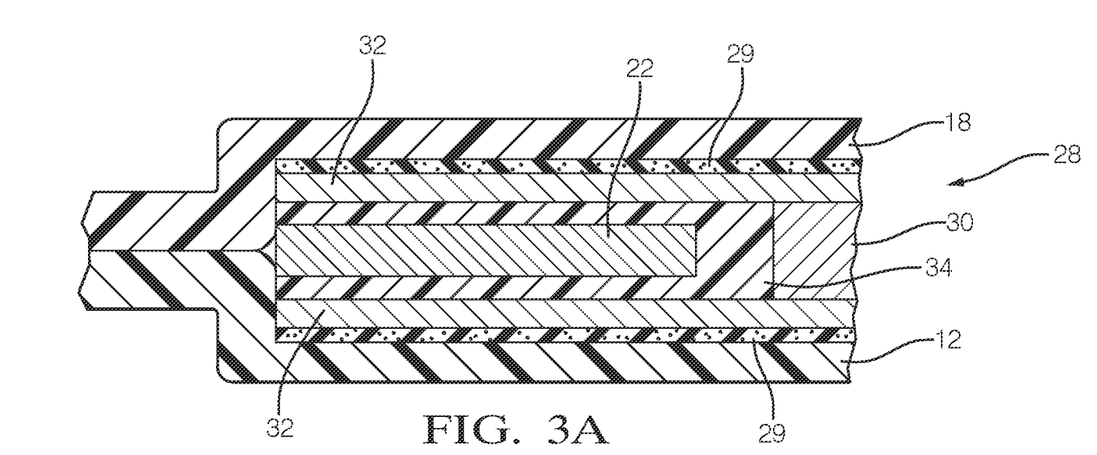
FIG. 3A is an illustration of an enlarged cross sectional view of a power conductor portion of the wiring harness assembly of FIG. 1 in accordance with one embodiment.
Figure 3B:
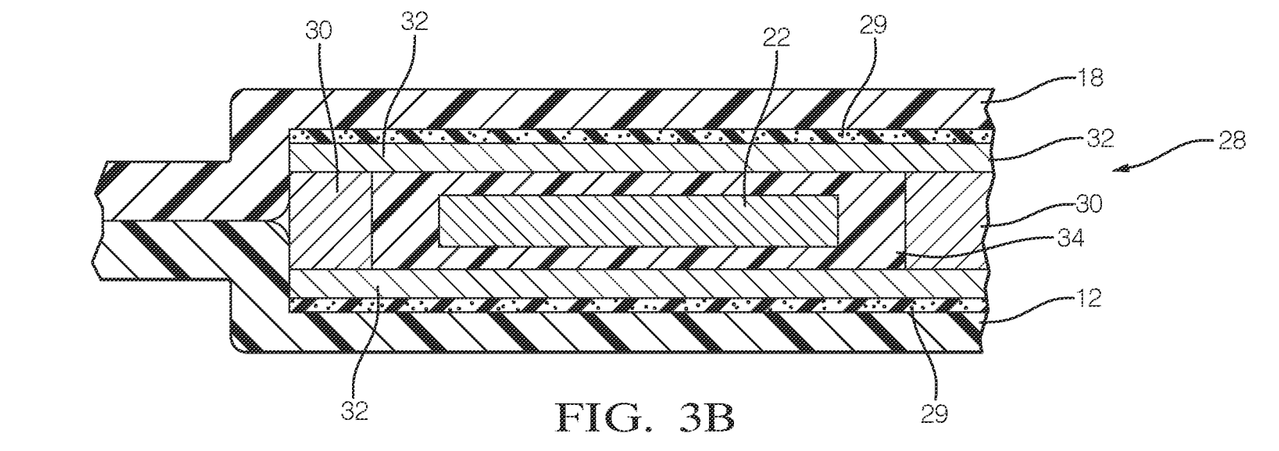
FIG. 3B is an illustration of an enlarged cross sectional view of a power conductor portion of the wiring harness assembly of FIG. 1 in accordance with one embodiment.

FIGS. 3A-3B illustrate examples of an enlarged cross sectional view of the power conductor 22 portion of the assembly 10. In these examples, the power conductor 22 is located proximate an edge of the assembly 10. In an example, a distance between a first side of the power conductor 22 and a first edge of the first flexible planar substrate 12 is about 2 mm. The assembly 10 further includes a power electromagnetic shield 28 surrounding the power conductor 22. The power electromagnetic shield 28 is configured to inhibit EMI from affecting the nearby signal conductors 24, data conductors 26, and/or other electrical components proximate the assembly 10. The EMI is generated by the magnetic field that surrounds the power conductor 22 that is created when the electrical power is transmitted through the power conductor 22. Electromagnetic shielding provides an electrically conductive barrier to attenuate (i.e., reduce) electromagnetic waves external to the shield, and provides a conduction path by which any induced electrical currents can be circulated and returned to the source by way of an electrical ground connection to the shield (not shown). As illustrated in FIGS. 3A-3B, an adhesive 29 is interposed between the power electromagnetic shield 28 and both the first flexible planar substrate 12 and the second flexible planar substrate 18. This adhesive 29 has the benefit of inhibiting a relative motion between the power electromagnetic shield 28 and both the first flexible planar substrate 12 and the second flexible planar substrate 18, that may cause damage to the power electromagnetic shield 28. In an example, the adhesive 29 also includes dielectric properties.

The power electromagnetic shield 28 includes at least one power shield trace 30 and at least one power shield foil 32, wherein the power shield trace 30 and the power shield foil 32 are in electrical contact in order to create a continuous shield. In the example illustrated in FIG. 3A, the power electromagnetic shield 28 terminates without wrapping around the side of the power conductor 22. This shielding arrangement provides sufficient EMI reduction when the power conductor 22 is located proximate the edge of the assembly 10, and the assembly 10 is not routed near any electronic devices that may require protection from EMI. In an example, a spacing between the power shield trace 30 and the power conductor 22 is about 1 mm. In an example, the thickness of the power shield trace 30 matches the thickness of the power conductor 22. In another example, the thickness of the power shield trace 30 is greater than the thickness of the power conductor 22. In an example the thickness of the power shield foil 32 is between 0.01 mm and 0.04 mm.

Both the power shield trace 30 and the power shield foil 32 are formed of continuous strips of electrically conductive material, such as copper, aluminum, silver, gold, or alloys thereof. In an example, the power shield trace 30 and the power shield foil 32 includes a conductive coating, such as tin or a tin alloy, to inhibit corrosion. In an example, the power shield trace 30 and the power shield foil 32 are formed of the same electrically conductive material as that of the power conductor 22. In another example, the power shield trace 30 and the power shield foil 32 are formed of a different electrically conductive material than that of the power conductor 22.

FIG. 3B illustrates an example where another power shield trace 30 is located along the first side of the power conductor 22, separating the power conductor 22 and the first edge of the first flexible planar substrate 12. In this example, the power electromagnetic shield 28 completely surrounds the power conductor 22. It will be appreciated that this shielding arrangement provides additional EMI shielding compared to that of FIG. 3A. While the example illustrated in FIG. 3B includes separate power shield foils 32 (i.e., an upper foil and a lower foil) individually attached to the first and second power shield traces 30, other arrangements of the power shield trace 30 and power shield foil 32 are envisioned, but not shown, such as a single power shield foil 32 that completely surrounds the power conductor 22, overlapping itself to create the continuous shield. In another example not shown, a single power shield foil 32 extends from a top side of a single power shield trace 30 and returns to a bottom side of the single power shield trace 30, completely surrounding the power conductor 22.

Referring again to FIGS. 3A-3B, a dielectric material 34 separates the power conductor 22 from both the power shield trace 30 and the power shield foil 32 to prevent a short circuit from occurring. It will be appreciated that the short circuit between the power conductor 22 and the power electromagnetic shield 28 will make the EMI shielding ineffective. The dielectric material 34 that separates the power conductor 22 and the power electromagnetic shield 28 may be any dielectric material 34 that is compatible with the requirements of the assembly 10 (e.g., dielectric breakdown strength, flexibility, etc.). One such dielectric material 34 is the RT/DUROID® 5880 from Rogers Corporation of Chandler, Ariz., USA. In an example, the dielectric material 34 includes adhesive properties to promote bonding between the power electromagnetic shield 28 and the power conductor 22. In another example, a separate adhesive 29 layer is interposed between the dielectric material 34 and the power conductor 22. The thickness of the dielectric material 34 is adjusted based on the dielectric breakdown strength of the dielectric material 34, and a voltage differential between the power conductor 22 and the power electromagnetic shield 28. In an example, the thickness of the dielectric material 34 is between about 0.1 mm and about 0.5 mm. In another example, the thickness of the dielectric material 34 is about 0.4 mm. In another example, the thickness of the dielectric material 34 is about 0.075 mm.

In an example, the assembly 10 includes a plurality of power conductors 22 arranged parallel to one another along the longitudinal axis 14 of the assembly 10. In an example, a spacing between adjacent power conductors 22 is at least 1.0 mm. In an example, the plurality of power conductors 22 are surrounded by the single power electromagnetic shield 28 with the dielectric material 34 separating the plurality of power conductors 22 from the single power electromagnetic shield 28. In another example, the plurality of power conductors 22 are individually surrounded by a plurality of power electromagnetic shields 28 with the dielectric material 34 separating the individual power conductors 22 from the corresponding power electromagnetic shield 28.

Figure 4A:
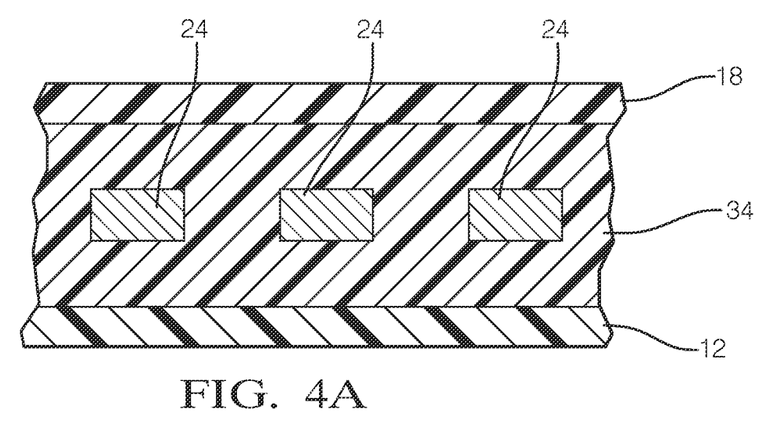
FIG. 4A is an illustration of an enlarged cross sectional view of a signal conductor portion of the wiring harness assembly of FIG. 1 in accordance with one embodiment.
Figure 4B:
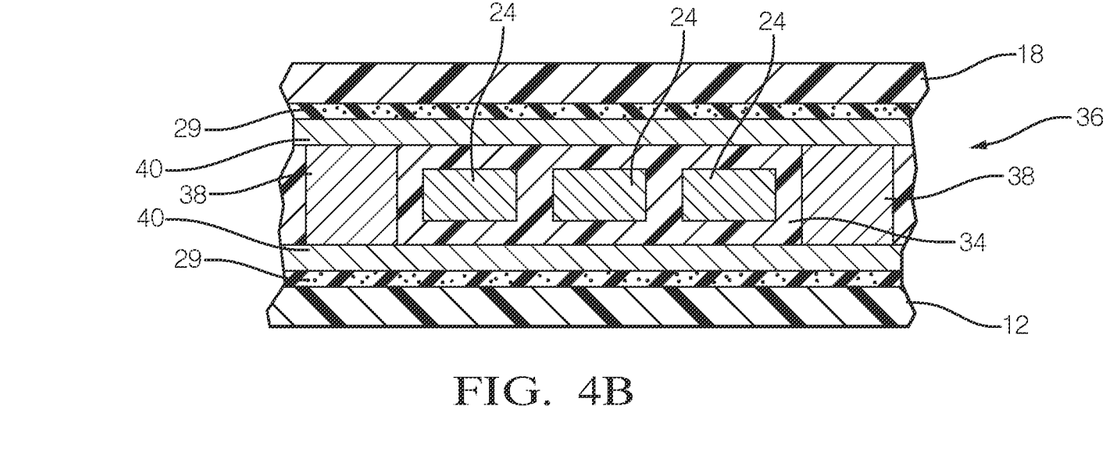
FIG. 4B is an illustration of an enlarged cross sectional view of a signal conductor portion of the wiring harness assembly of FIG. 1 in accordance with one embodiment.

FIGS. 4A-4B illustrate examples of an enlarged cross sectional view of the signal conductor 24 portion of the assembly 10, showing three separate signal conductors 24. It will be appreciated that any number of signal conductors 24 may be included within the assembly 10 to meet the requirements of the vehicle electrical system. In an example, the signal conductor 24 comprises a single continuous strip of electrically conductive material, such as copper, aluminum, silver, gold, or alloys thereof. In another example, the electrically conductive material includes a conductive coating, such as tin or a tin alloy, to inhibit corrosion. The signal conductor 24 is not configured to transmit the same levels of electrical power as that of the power conductor 22 and does not have the same cross sectional area as the power conductor 22 to achieve the desired electrical resistance. In an example, the signal conductor 24 has a width of less than 2.0 mm and a thickness less than about 1.0 mm. In the examples illustrated in FIGS. 4A-4B, the signal conductor 24 has a width of about 1.54 mm, and a thickness of about 0.7 mm.

Referring to FIG. 4A, three unshielded signal conductors 24 are surrounded by the dielectric material 34. In this example, the unshielded signal conductors 24 are protected from the EMI of the adjacent power conductor 22 by the power electromagnetic shield 28. In this example, the dielectric material 34 is the same dielectric material 34 that surrounds the power conductor 22 of FIGS. 3A-3B, with the thickness adjusted to account for the lack of a shield trace and a shield foil. In an example, the spacing between the adjacent signal conductors 24 is at least 1.0 mm to inhibit the occurrence of crosstalk.

In another example illustrated in FIG. 4B, the three signal conductors 24 are protected from the EMI by a signal electromagnetic shield 36. The signal electromagnetic shield 36 includes at least one signal shield trace 38 and at least one signal shield foil 40. In an example, the dielectric material 34 separates the signal conductors 24 from both the signal shield trace 38 and the signal shield foil 40 to prevent a short circuit from occurring. In an example, the dielectric material 34 includes adhesive properties to promote bonding between the signal electromagnetic shield 36 and the signal conductor 24. In another example, a separate adhesive 29 layer is interposed between the dielectric material 34 and the signal conductor 24. The thickness of the dielectric material 34 is adjusted based on the dielectric breakdown strength of the dielectric material 34, and a voltage differential between the signal conductor 24 and the signal electromagnetic shield 36. In an example, the thickness of the dielectric material 34 is between about 0.1 mm and about 0.5 mm. In another example, the thickness of the dielectric material 34 is about 0.4 mm. In another example, the thickness of the dielectric material 34 is about 0.075 mm.

Figure 5A:
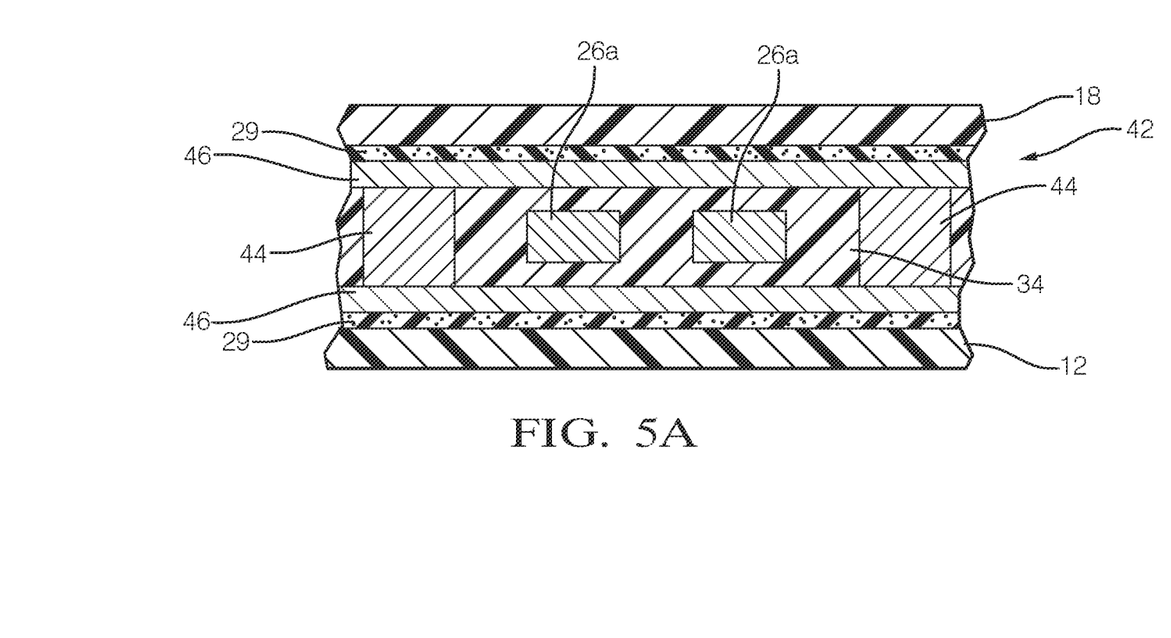
FIG. 5A is an illustration of an enlarged cross sectional view of a data conductor portion of the wiring harness assembly of FIG. 1 in accordance with one embodiment.
Figure 5B:
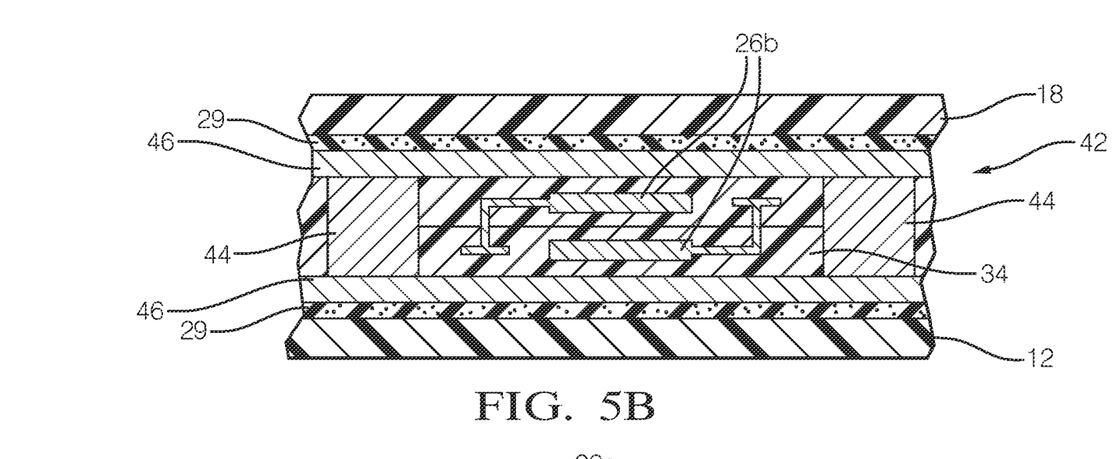
FIG. 5B is an illustration of an enlarged cross sectional view of a data conductor portion of the wiring harness assembly of FIG. 1 in accordance with one embodiment.
Figure 5C:
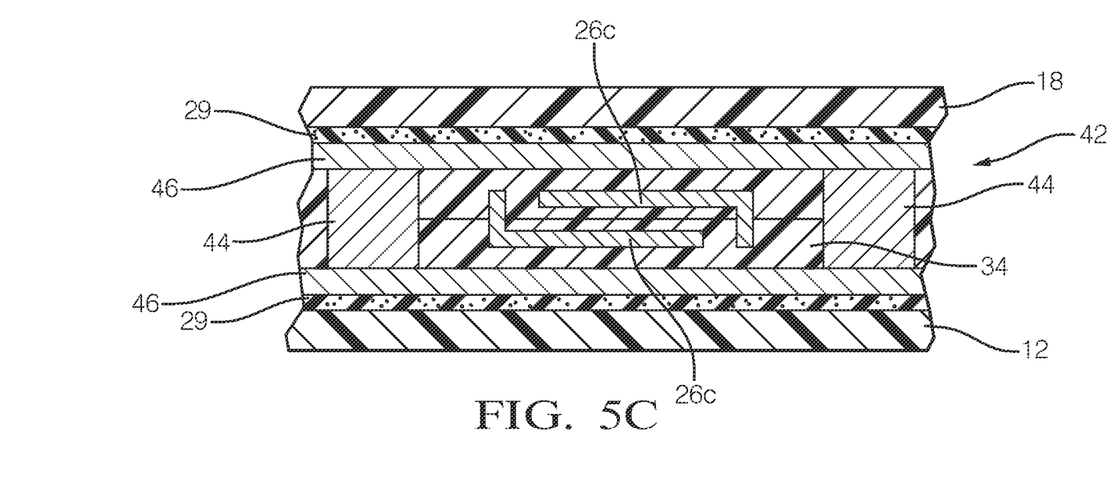
FIG. 5C is an illustration of an enlarged cross sectional view of a data conductor portion of the wiring harness assembly of FIG. 1 in accordance with one embodiment.

FIGS. 5A-5C illustrate three examples of an enlarged cross sectional view of the data conductor 26 portion of the assembly 10, showing a pair of continuous strips of conductive material, hereafter referred to as a data pair. In an example, the data pair is formed of continuous strips of electrically conductive material, such as copper, aluminum, silver, gold, or alloys thereof. In another example, the electrically conductive material includes a conductive coating, such as tin or a tin alloy, to inhibit corrosion. Like the signal conductor 24, the data conductor 26 is not configured to transmit the same levels of electrical power as that of the power conductor 22 and does not have the same cross sectional area as the power conductor 22 to achieve the desired electrical resistance. In an example, the individual traces of the data conductor 26 have the width of less than 0.5 mm and the thickness less than about 1.0 mm. In the examples illustrated in FIGS. 5A-5C, the individual traces of the data conductor 26 have the width of about 0.3 mm, and the thickness of about 0.7 mm. Additionally, the spacing (i.e., spacing along the longitudinal axis 14, lateral axis 16, and vertical axis) between individual traces of the data conductor 26 are at least 0.3 mm to inhibit crosstalk between the individual traces.

FIG. 5A illustrates the data pair of a data conductor 26A that are parallel and coplanar (i.e., side-by-side conductors in a same plane). FIG. 5B illustrates the data pair of a data conductor 26B that are parallel and lay in separate parallel planes (i.e., over-under conductors in different planes). FIG. 5C illustrates the data pair of a data conductor 26C that are a twisted pair that alternate between separate planes at regular intervals (i.e., a twist rate, pitch of the twist, etc.). The twisted pair is a type of wiring arrangement that reduces electromagnetic radiation from the pair of conductors, reduces crosstalk between adjacent pairs of conductors, and improves a rejection of any external EMI. In the planar assembly 10, the twist in the data conductors 26C is accomplished by vertical connections made to alternating short segments of the data conductors 26C disposed on separate parallel planes. The alternating short segments form a crisscross pattern when viewed along the vertical axis, which creates the twisted arrangement.

In the three examples illustrated in FIGS. 5A-5C, the conductors are separated from one another by the dielectric material 34 that is the same dielectric material 34 described above in FIGS. 3A-4B. In these examples, the thickness of the dielectric material 34 is adjusted based on the thickness of the data conductors 26.

Referring again to FIGS. 5A-5C, the assembly 10 further includes a data electromagnetic shield 42 to protect the data conductor 26 from EMI. The data electromagnetic shield 42 includes at least one data shield trace 44 and at least one data shield foil 46. In an example, the dielectric material 34 separates the data conductors 26 from both the data shield trace 44 and the data shield foil 46 to prevent a short circuit from occurring. In an example, the dielectric material 34 includes adhesive properties to promote bonding between the data electromagnetic shield 42 and the data conductor 26. In another example, a separate adhesive 29 layer is interposed between the dielectric material 34 and the data conductor 26. The thickness of the dielectric material 34 is adjusted based on the dielectric breakdown strength of the dielectric material 34, and a voltage differential between the signal conductor 24 and the data electromagnetic shield 42, and/or the voltage differential between the data pair. In an example, the thickness of the dielectric material 34 is between about 0.1 mm and about 0.5 mm. In another example, the thickness of the dielectric material 34 is about 0.4 mm. In another example, the thickness of the dielectric material 34 is about 0.075 mm. In yet another example, the thickness of the dielectric material 34 between the data pair is at least 0.3 mm.

Referring back to FIG. 1, the assembly 10 includes a first flexible planar wire cable 48 having a first plurality of separated conductors 20A formed in a first insulating layer. The assembly 10 also includes at least one second flexible planar wire cable 50 having a second plurality of separated conductors 20B formed in a second insulating layer. In an example, the first flexible planar wire cable 48 and the at least one second flexible planar wire cable 50 are initially formed as part of a single flexible planar wire cable that is sectioned to create separate lengths of cable. In the example illustrated in FIG. 1, the first insulating layer and the second insulating layer are formed of the first flexible planar substrate 12, the second flexible planar substrate 18, the dielectric material 34, and the adhesive 29, that together insulate portions of the first plurality of separated conductors 20A and the second plurality of separated conductors 20B. In an example, the at least one second flexible planar wire cable 50 extends from the first flexible planar wire cable 48 in a direction obtuse to the longitudinal axis 14 of the first flexible planar wire cable 48. In another example, the at least one second flexible planar wire cable 50 extends from the first flexible planar wire cable 48 in a direction parallel to the longitudinal axis 14 of the first flexible planar wire cable 48. In the example illustrated in FIG. 1, the at least one second flexible planar wire cable 50 extends from the first flexible planar wire cable 48 in a direction orthogonal to the longitudinal axis 14 of the first flexible planar wire cable 48 (i.e., along the lateral axis 16 of the assembly 10).

In an example, the first plurality of separated conductors 20A include a first at least one power conductor 22A surrounded by a first power electromagnetic shield 28A, a first at least one signal conductor 24A surrounded by a first signal electromagnetic shield 36A, and a first at least one data conductor 26D surrounded by a first data electromagnetic shield 42A. The second plurality of separated conductors 20B include a second at least one power conductor 22B surrounded by a second power electromagnetic shield 28B, a second at least one signal conductor 24B surrounded by a second signal electromagnetic shield 36B, and a second at least one data conductor 26E surrounded by a second data electromagnetic shield 42B.

In another example, the first plurality of separated conductors 20A include the first at least one power conductor 22A surrounded by the first power electromagnetic shield 28A, the first at least one signal conductor 24A that is unshielded, and the first at least one data conductor 26D surrounded by the first data electromagnetic shield 42A. The second plurality of separated conductors 20B include a second at least one power conductor 22B surrounded by a second power electromagnetic shield 28B, a second at least one signal conductor 24B that is unshielded, and a second at least one data conductor 26E surrounded by a second data electromagnetic shield 42B.

Figure 6:
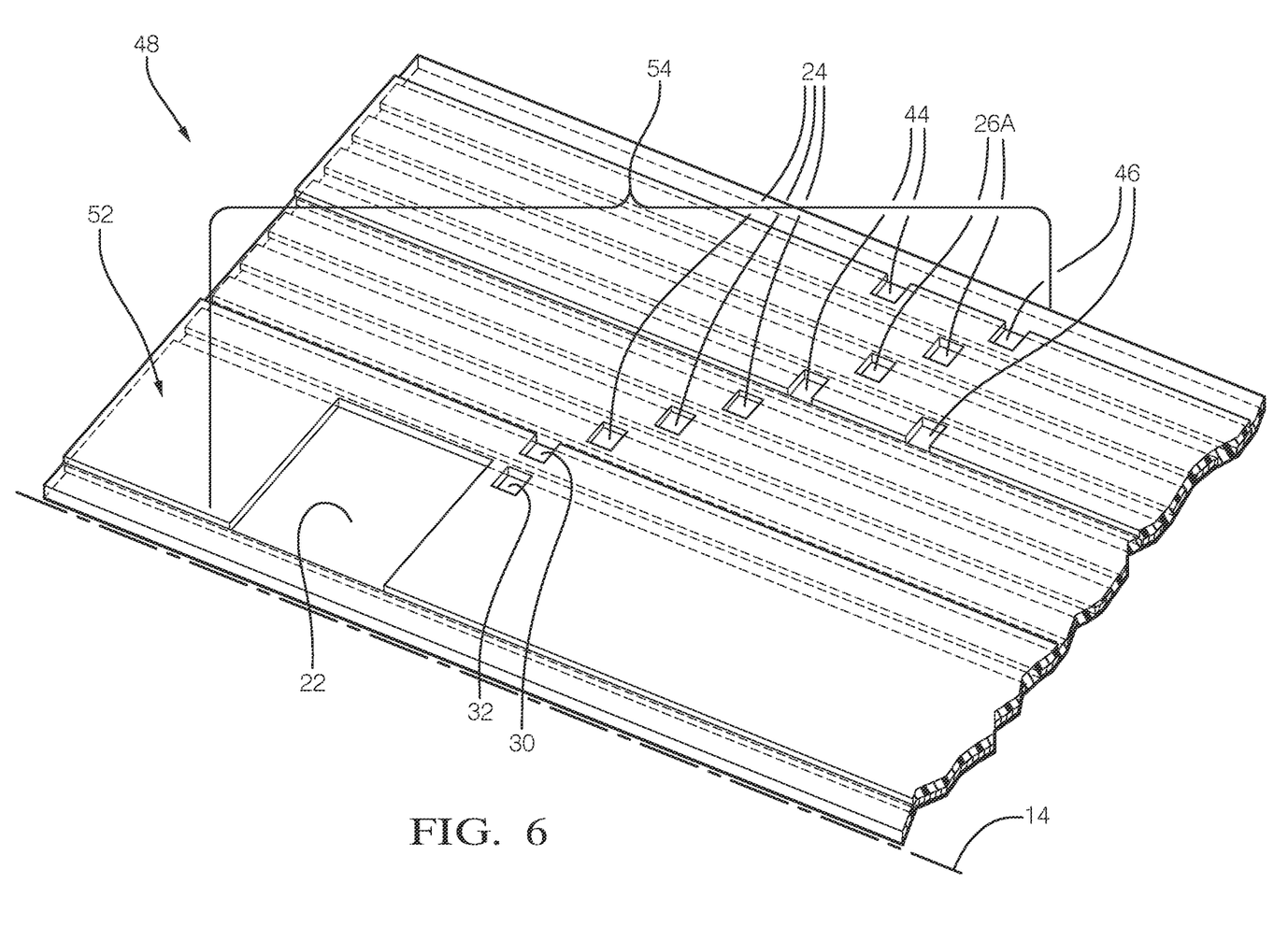
FIG. 6 is a top perspective view of a portion of a first flexible planar wire cable of the wiring harness assembly of FIG. 1 in accordance with one embodiment.

FIG. 6 illustrates a portion of the first flexible planar wire cable 48 isolated from the assembly 10 of FIG. 1. The first insulating layer includes a first substantially flat exterior surface 52 that defines a first plurality of apertures 54. The first plurality of apertures 54 expose at least a portion of the one or more of the first plurality of separated conductors 20A and/or first electromagnetic shields. In an example, the exposed portions of each of the first plurality of separated conductors 20A and/or first electromagnetic shields include a coating of conductive material, such as a tin plating or tin alloy plating. The first plurality of apertures 54 are arranged in clusters (i.e., bunches, groups, collections, bands, etc.) along the longitudinal axis 14 of the first flexible planar wire cable 48. In an example, the clusters are repeated at a predetermined interval along the longitudinal axis 14 of the first flexible planar wire cable 48. That is, the clusters of the first plurality of apertures 54 are repeated at regular intervals along a length of the first flexible planar wire cable 48, the purpose of which will be explained below.

The first plurality of apertures 54 are sized, shaped, and arranged such that arranging a second substantially flat exterior surface 56 of the second flexible planar wire cable 50 in contact with the first substantially flat exterior surface 52 enables an electrical connection 60 between the at least one second flexible planar wire cable 50 and the first flexible planar wire cable 48. It will be appreciated that the second substantially flat exterior surface 56 of the second flexible planar wire cable 50 is the surface that is defined by the first flexible planar substrate 12, while the first substantially flat exterior surface 52 is the surface that is defined by the second flexible planar substrate 18. In the example illustrated in FIG. 6, the first plurality of apertures 54 within the clusters are arranged in a staggered pattern relative to one another along the longitudinal axis 14 of the first flexible planar wire cable 48. The staggered pattern of the first plurality of apertures 54 enables the electrical connection 60 between one or more of the first plurality of separated conductors 20A and one or more of the second plurality of separated conductors 20B and/or between the first electromagnetic shields and the second electromagnetic shields.

Figure 7:
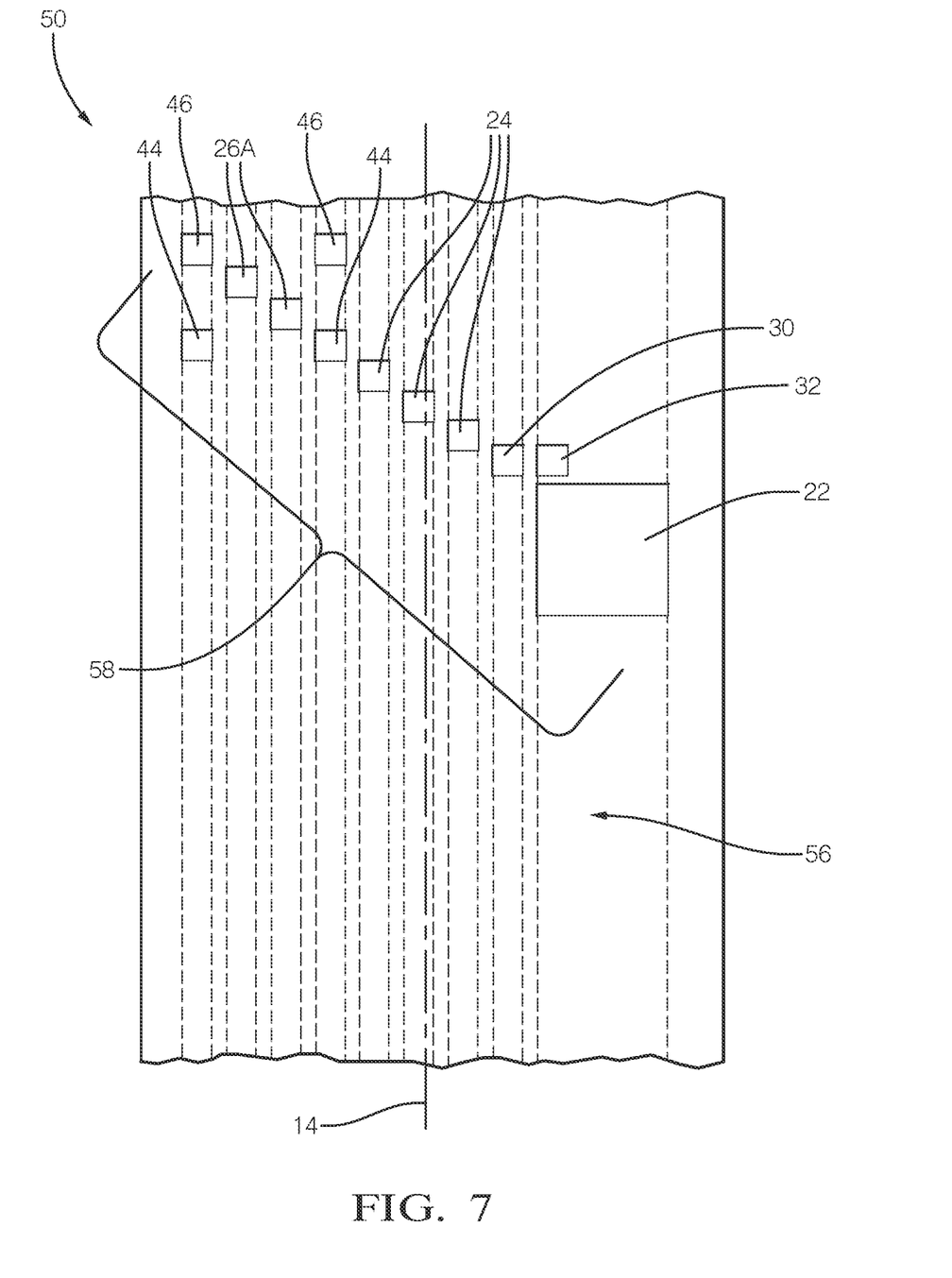
FIG. 7 is a bottom view of a portion of a second flexible planar wire cable of the wiring harness assembly of FIG. 1 in accordance with one embodiment.

FIG. 7 illustrates a bottom view of a portion of the second flexible planar wire cable 50 isolated from the assembly 10 of FIG. 1. The second substantially flat exterior surface 56 of the second flexible planar wire cable 50 defines a second plurality of apertures 58 that expose at least a portion of one or more of the second plurality of separated conductors 20B and/or second electromagnetic shields. In an example, the exposed portions of each of the second plurality of separated conductors 20B and/or first electromagnetic shields include a coating of conductive material, such as a tin plating or tin alloy plating. The second plurality of apertures 58 are sized, shaped, and arranged to overlay the first plurality of apertures 54 to enable the electrical connections 60. In an example, the second plurality of apertures 58 are arranged in clusters along the longitudinal axis 14 of the second flexible planar wire cable 50. In the example illustrated in FIG. 1, the longitudinal axis 14 of the second flexible planar wire cable 50 is aligned with the lateral axis 16 of the assembly 10. In an example, the clusters are repeated at a predetermined interval along the longitudinal axis 14 of the second flexible planar wire cable 50. In the example illustrated in FIG. 1, only a single cluster of the second plurality of apertures 58 exists to make the electrical connection 60 between the second flexible planar wire cable 50 and the first flexible planar wire cable 48. In the example illustrated in FIG. 7, the second plurality of apertures 58 within the cluster are arranged in the staggered pattern relative to one another along the longitudinal axis 14 of the second flexible planar wire cable 50. The staggered pattern of the second plurality of apertures 58 enables the electrical connection 60 between one or more of the first plurality of separated conductors 20A and one or more of the second plurality of separated conductors 20B and/or between the first electromagnetic shields and the second electromagnetic shields.

Figure 8:
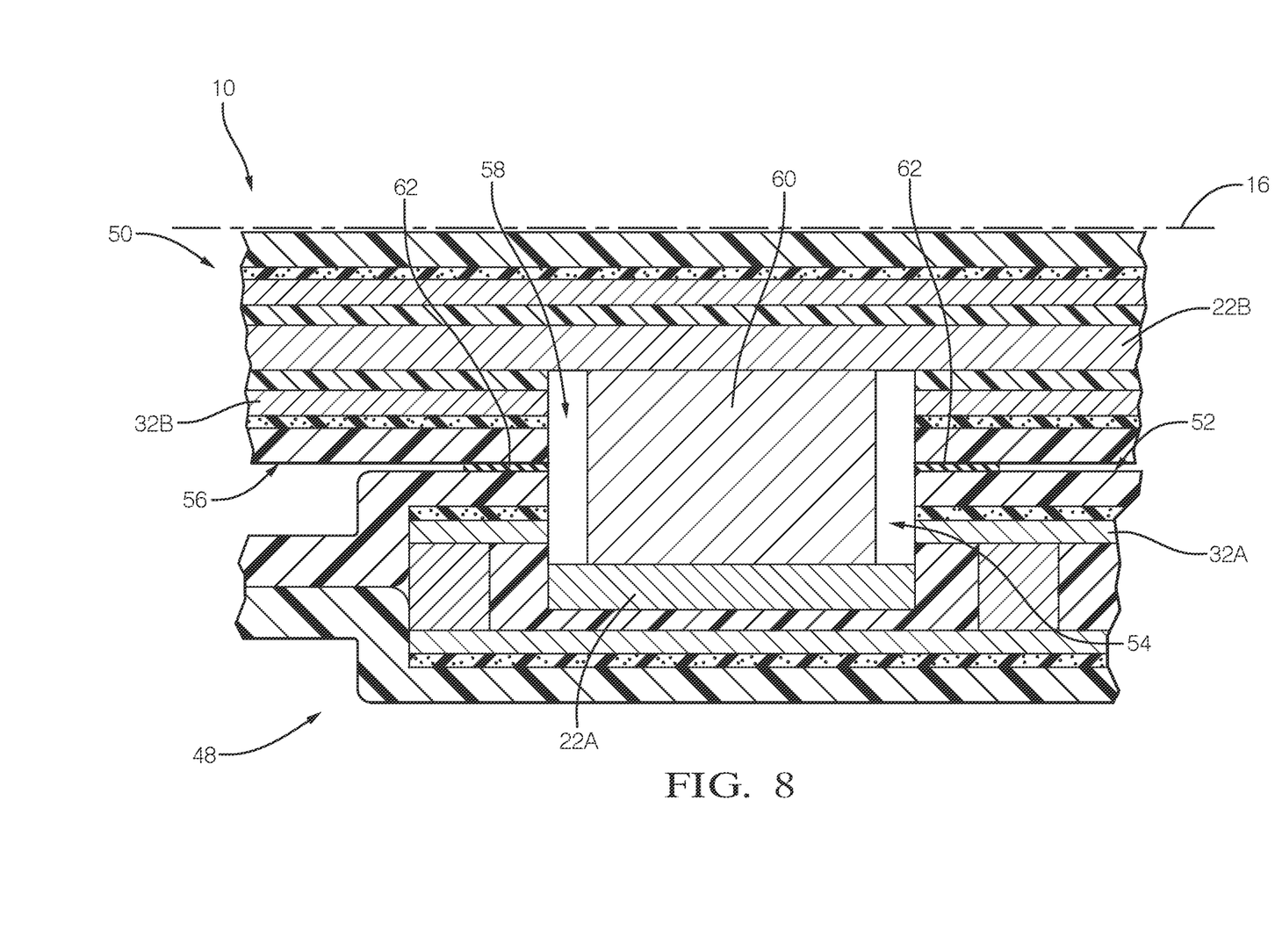
FIG. 8 is a section view of an electrical connection of the assembly of FIG. 1 in accordance with one embodiment.

FIG. 8 illustrates an example of a bond 62 between the first flexible planar wire cable 48 and the second flexible planar wire cable 50. For the purposes of illustration, a section view of the power conductor 22 portion of the assembly 10 is shown, and the description below will apply to the bonds 62 between the other portions of the assembly 10. In an example, the bonds 62 between the first substantially flat exterior surface 52 and the second substantially flat exterior surface 56 are located proximate a perimeter of each of the first plurality of apertures 54 and each of the second plurality of apertures 58. In an example, the bond 62 is achieved with an adhesive, such as an epoxy or silicone rubber. In an example, the bond 62 is achieved through localized heating of the first substantially flat exterior surface 52 and the second substantially flat exterior surface 56. In another example, the bond 62 is achieved by a chemical solvent that assists in a crosslinking between the first substantially flat exterior surface 52 and the second substantially flat exterior surface 56. In an example, the bond 62 exists along the full length of contact between the first substantially flat exterior surface 52 and the second substantially flat exterior surface 56.

FIG. 8 also illustrates an example of the electrical connection 60 between the first flexible planar wire cable 48 and the second flexible planar wire cable 50. In an example, the electrical connections 60 between the one or more of the first plurality of separated conductors 20A and the one or more of the second plurality of separated conductors 20B is a metallurgical bond. In an example, the metallurgical bond is a weld joint from a high frequency weld, or a resistance weld. In another example, the metallurgical bond is a solder joint. In an example, the electrical connections 60 between the one or more of the first plurality of separated conductors 20A and the one or more of the second plurality of separated conductors 20B is a mechanical bond enabled by a compressive fitting applied to opposing surfaces of both the first flexible planar wire cable 48 and the second flexible planar wire cable 50. In another example, the mechanical bond is enabled by a staking operation between the first flexible planar wire cable 48 and the second flexible planar wire cable 50.

Referring again to FIG. 8, in this example the first at least one power conductor 22A of the first plurality of separated conductors 20A is electrically connected to the second at least one power conductor 22B of the second plurality of separated conductors 20B. It will be understood that the example illustrated in FIG. 8, and the description below, will also apply to the electrical connections 60 (not shown) between the first at least one signal conductor 24A and the second at least one signal conductor 24B, as well as the electrical connections 60 (not shown) between the first at least one data conductor 26D and the second at least one data conductor 26E. In an example, the electrical connections 60 between the first at least one data conductor 26D and the second at least one data conductor 26E illustrated in FIG. 5B are enabled by lateral offset conductors (not specifically shown) that create lateral connection points for the superimposed data conductors 26.

In the example illustrated in FIG. 8, the electrical connection 60 is the metallurgical bond. The electrical connection 60 is made within the apertures 54, 58 such that no short circuits exist between the power conductors 22A, 22B and the corresponding electromagnetic shielding. In the example illustrated in FIG. 8, a lateral gap exists between the electrical connection 60 and the surrounding components. In another example, the gap is filled with the dielectric material 34 to inhibit short circuits. A dimension of the gap and/or the dielectric material 34 within the gap is adjusted based on the voltage differential between the power conductors 22A and 22B, and the surrounding electromagnetic shielding. In an example, the dimension of the gap is at least 0.3 mm.

Figure 9:
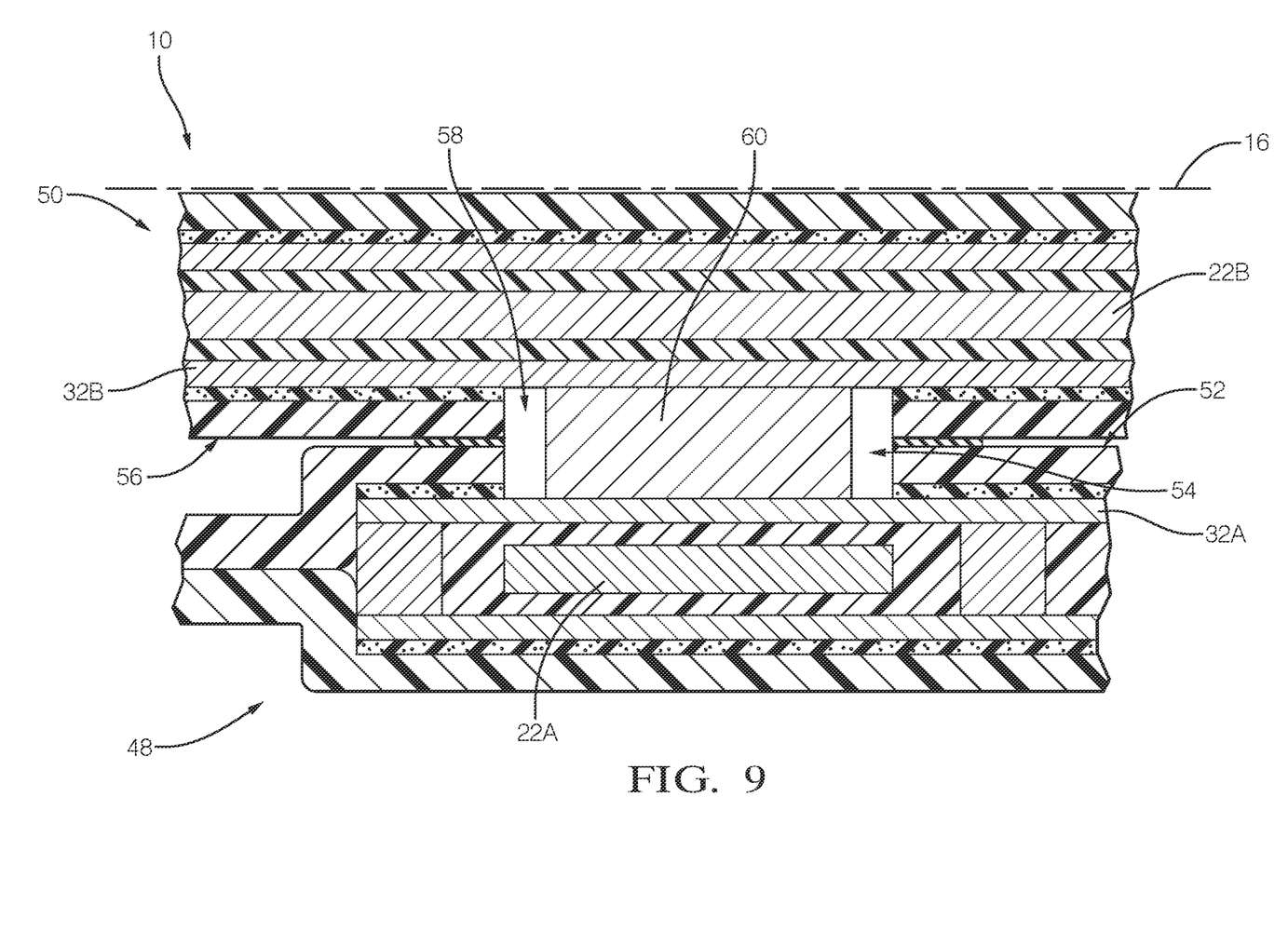
FIG. 9 is a section view of another electrical connection of the assembly of FIG. 1 in accordance with one embodiment.

FIG. 9 illustrates the electrical connection 60 between the one or more first electromagnetic shields of the first plurality of separated conductors 20A and the one or more second electromagnetic shields of the second plurality of separated conductors 20B. In this example, a first power shield foil 32A of the first plurality of separated conductors 20A is electrically connected to a second power shield foil 32B of the second plurality of separated conductors 20B. It will be understood that the example illustrated in FIG. 9, and the description below, will also apply to the electrical connections 60 (not shown) between a first signal shield foil 40A and a second signal shield foil 40B, as well as the electrical connections 60 (not shown) between a first data shield foil 46A and a second data shield foil 46B. In the example illustrated in FIG. 9, the electrical connection 60 is the metallurgical bond and is made within the apertures 54, 58. In the example illustrated in FIG. 9, a lateral gap exists between the electrical connection 60 and the surrounding components. In another example, the gap is filled with the dielectric material 34.

Figure 10:
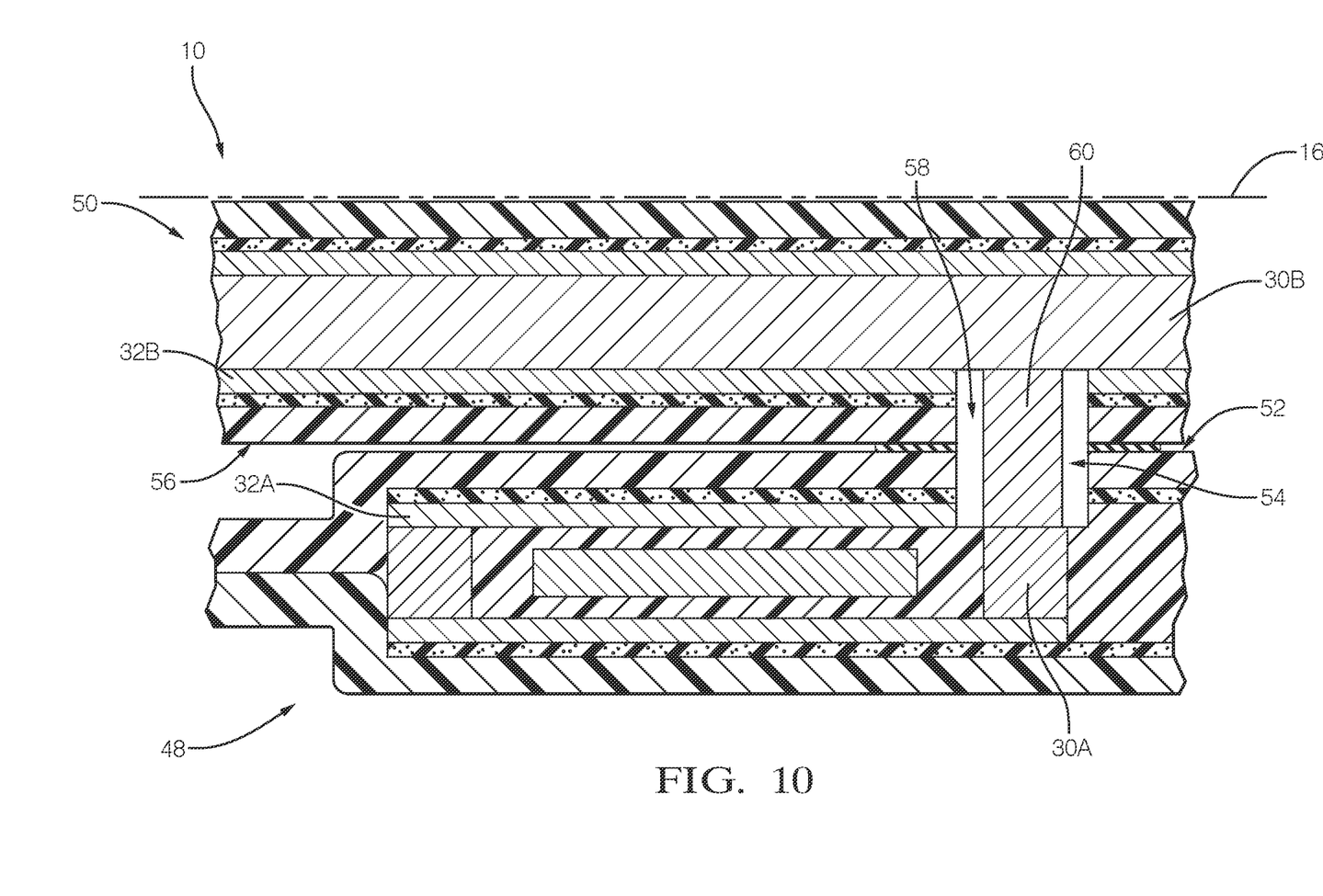
FIG. 10 is a section view of yet another electrical connection of the assembly of FIG. 1 in accordance with one embodiment.

FIG. 10 illustrates another example of the electrical connection 60 between the one or more first electromagnetic shields of the first plurality of separated conductors 20A and the one or more second electromagnetic shields of the second plurality of separated conductors 20B. In this example, a first power shield trace 30A of the first plurality of separated conductors 20A is electrically connected to a second power shield trace 30B of the second plurality of separated conductors 20B. It will be understood that the example illustrated in FIG. 10, and the description below, will also apply to the electrical connections 60 (not shown) between a first signal shield trace 38A and a second signal shield trace 38B, as well as the electrical connections 60 (not shown) between a first data shield trace 44A and a second data shield trace 44B. In the example illustrated in FIG. 10, the electrical connection 60 is the metallurgical bond and is made within the apertures 54, 58. In the example illustrated in FIG. 10, a lateral gap exists between the electrical connection 60 and the surrounding components. In another example, the gap is filled with the dielectric material 34.

Accordingly, a wiring harness assembly 10 (the assembly 10), is provided. The assembly 10 is an improvement over other wiring harness assemblies because the assembly 10 includes the at least one data conductor 26 configured to transmit network data communications in a flexible planar package, along with the at least one power conductor 22 and the at least one signal conductor 24.

While this invention has been described in terms of the preferred embodiments thereof, it is not intended to be so limited, but rather only to the extent set forth in the claims that follow. "One or more" includes a function being performed by one element, a function being performed by more than one element, e.g., in a distributed fashion, several functions being performed by one element, several functions being performed by several elements, or any combination of the above. It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact. The terminology used in the description of the various described embodiments herein is for the purpose of describing particular embodiments only and is not intended to be limiting. As used in the description of the various described embodiments and the appended claims, the singular forms "a", "an", and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

The invention claimed is:

1. A wiring harness assembly, comprising:
   a first flexible planar wire cable having a first plurality of separated conductors formed in a first insulating layer comprising a first substantially flat exterior surface;
   a second flexible planar wire cable having a second plurality of separated conductors formed in a second insulating layer comprising a second substantially flat exterior surface; and
   a first plurality of apertures formed in the first substantially flat exterior surface and a second plurality of apertures formed in the second substantially flat exterior surface, wherein the first and second plurality of apertures are sized, shaped, and arranged such that the first and second plurality of separated conductors are connected to each other within the first and second plurality of apertures.

2. The wiring harness assembly in accordance with claim 1, wherein the first and second plurality of separated conductors are connected within the first and second plurality of apertures when the first substantially flat exterior surface is in contact with the second substantially flat exterior surface.

3. The wiring harness assembly in accordance with claim 1, further comprising:
   a first electromagnetic shield enclosing the first plurality of separated conductors; and
   a second electromagnetic shield enclosing the second plurality of separated conductors.

4. The wiring harness assembly in accordance with claim 3, wherein the first electromagnetic shield is electrically connected to the second electromagnetic shield.

5. The wiring harness assembly in accordance with claim 3, further comprising:
   a first adhesive layer between the first electromagnetic shield and the first insulating layer; and
   a second adhesive layer between the second electromagnetic shield and the second insulating layer.

6. The wiring harness assembly in accordance with claim 3, wherein the first plurality of separated conductors comprises:

a first power conductor configured to transmit electrical power;

a first signal conductor configured to transmit electrical signals; and a first data conductor configured to transmit network data communications and wherein the second plurality of separated conductors comprises:

a second power conductor configured to transmit the electrical power;

a second signal conductor configured to transmit the electrical signals; and a second data conductor configured to transmit the network data communications.

7. The wiring harness assembly in accordance with claim 6, wherein the first electromagnetic shield comprises a first power electromagnetic shield providing electromagnetic shielding for the first power conductor and wherein the second electromagnetic shield comprises a second power electromagnetic shield providing electromagnetic shielding for the second power conductor.

8. The wiring harness assembly in accordance with claim 7, wherein the first signal conductor is unshielded and wherein the second signal conductor is unshielded.

9. The wiring harness assembly in accordance with claim 7, wherein the first electromagnetic shield comprises a first signal electromagnetic shield providing electromagnetic shielding for the first signal conductor, wherein the second electromagnetic shield comprises a second signal electromagnetic shield providing electromagnetic shielding for the second signal conductor, and wherein the first signal electromagnetic shield is separate from the first power electromagnetic shield and the second signal electromagnetic shield is separate from the second power electromagnetic shield.

10. The wiring harness assembly in accordance with claim 7, wherein the first electromagnetic shield comprises a first data electromagnetic shield providing electromagnetic shielding for the first data conductor, wherein the second electromagnetic shield comprises a second data electromagnetic shield providing electromagnetic shielding for the second data conductor, and wherein the first data electromagnetic shield is separate from the first power electromagnetic shield and the second data electromagnetic shield is separate from the second power electromagnetic shield.

11. The wiring harness assembly in accordance with claim 6, wherein the first power conductor of the first plurality of separated conductors is electrically connected to the second power conductor of the second plurality of separated conductors.

12. The wiring harness assembly in accordance with claim 6, wherein the first signal conductor of the first plurality of separated conductors is electrically connected to the second signal conductor of the second plurality of separated conductors.

13. The wiring harness assembly in accordance with claim 6, wherein the first data conductor of the first plurality of separated conductors is electrically connected to the second data conductor of the second plurality of separated conductors.

14. The wiring harness assembly in accordance with claim 1, wherein the first plurality of apertures is arranged in clusters along a longitudinal axis of the first flexible planar wire cable.

15. The wiring harness assembly in accordance with claim 14, wherein the clusters are repeated at a predetermined interval along the longitudinal axis of the first flexible planar wire cable.

16. The wiring harness assembly in accordance with claim 14, wherein the first plurality of apertures within the clusters are arranged in a staggered pattern relative to one another along the longitudinal axis of the first flexible planar wire cable.

17. The wiring harness assembly in accordance with claim 1, wherein the second plurality of apertures are arranged in clusters along a longitudinal axis of the second flexible planar wire cable.

18. The wiring harness assembly in accordance with claim 17, wherein the clusters are repeated at a predetermined interval along the longitudinal axis of the second flexible planar wire cable.

19. The wiring harness assembly in accordance with claim 17, wherein the second plurality of apertures within the clusters are arranged in a staggered pattern relative to one another along the longitudinal axis of the second flexible planar wire cable.

20. The wiring harness assembly in accordance with claim 1, wherein the first substantially flat exterior surface is bonded to the second substantially flat exterior surface.

* * * * *